(12) United States Patent
Park et al.

(10) Patent No.: US 8,951,835 B2
(45) Date of Patent: Feb. 10, 2015

(54) METHOD OF FABRICATING A PACKAGE SUBSTRATE

(71) Applicants: Samsung Electro-Mechanics Co., Ltd., Suwon (KR); Sungkyunkwan University Foundation for Corporate Collaboration, Suwon (KR)

(72) Inventors: Seung Wook Park, Suwon (KR); Young Do Kweon, Seoul (KR); Jang Hyun Kim, Suwon (KR); Tae Seok Park, Suwon (KR); Su Jeong Suh, Suwon (KR); Jae Gwon Jang, Goheung (KR); Nam Jung Kim, Suwon (KR); Seung Kyu Lim, Uiwang (KR); Kwang Keun Lee, Wonju (KR)

(73) Assignees: Samsung Electro-Mechanics Co., Ltd., Suwon (KR); Sungkyunkwan University Foundation for Corporate Collaboration, Suwon (KR)

( * ) Notice: Subject to any disclaimer, the term of this patent is extended or adjusted under 35 U.S.C. 154(b) by 0 days.

(21) Appl. No.: 14/063,672

(22) Filed: Oct. 25, 2013

(65) Prior Publication Data

US 2014/0051212 A1  Feb. 20, 2014

Related U.S. Application Data

(62) Division of application No. 13/064,437, filed on Mar. 24, 2011, now abandoned.

(30) Foreign Application Priority Data

Apr. 8, 2010  (KR) .................. 10-2010-0032244

(51) Int. Cl.
*H01L 21/44* (2006.01)
*H01L 21/50* (2006.01)
(Continued)

(52) U.S. Cl.
CPC ................ *H01L 21/50* (2013.01); *H01L 23/13* (2013.01); *H01L 23/147* (2013.01);
(Continued)

(58) Field of Classification Search
USPC .......... 438/106–127; 257/679–733, 782–784; 361/765–766
See application file for complete search history.

(56) References Cited

U.S. PATENT DOCUMENTS

| 5,795,799 A | 8/1998 | Hosoya ........................ 438/126 |
| 2002/0195705 A1 | 12/2002 | Terui et al. |

(Continued)

FOREIGN PATENT DOCUMENTS

| CN | 1396667 A | 2/2003 |
| CN | 101256984 A | 9/2008 |

(Continued)

OTHER PUBLICATIONS

Korean Office Action issued Nov. 1, 2011 in corresponding Korean Patent Application No. 10-2010-0032244.

(Continued)

*Primary Examiner* — Matthew W Such
*Assistant Examiner* — Ali Naraghi

(57) ABSTRACT

A method of fabricating a package substrate, includes forming a cavity in at least one region of an upper surface of a wafer, the cavity including a chip mounting region, forming a through-hole penetrating through the wafer and a via filling the through-hole, forming a first wiring layer and a second wiring layer spaced apart from the first wiring layer, which are extended into the cavity, and mounting a chip in the cavity to be connected to the first wiring layer and the second wiring layer.

12 Claims, 4 Drawing Sheets

(51) Int. Cl.
- *H01L 23/13* (2006.01)
- *H01L 23/14* (2006.01)
- *H01L 23/498* (2006.01)
- *H01L 23/00* (2006.01)

(52) U.S. Cl.
CPC ......... *H01L 23/49827* (2013.01); *H01L 24/16* (2013.01); *H01L 24/13* (2013.01); *H01L 2224/16146* (2013.01); *H01L 2224/16235* (2013.01); *H01L 2924/01033* (2013.01); *H01L 2924/01078* (2013.01); *H01L 2924/01082* (2013.01); *H01L 2924/19015* (2013.01); *H01L 2924/19041* (2013.01); *H01L 2224/131* (2013.01); *H01L 2924/01006* (2013.01); *H01L 2924/01019* (2013.01); *H01L 2924/01023* (2013.01); *H01L 2924/014* (2013.01); *H01L 2924/0001* (2013.01)
USPC .......................................... 438/106; 436/107

(56) References Cited

U.S. PATENT DOCUMENTS

| | | |
|---|---|---|
| 2005/0265671 A1 | 12/2005 | Ono et al. |
| 2006/0012048 A1 | 1/2006 | Murai et al. |
| 2007/0194876 A1 | 8/2007 | Lim et al. ...................... 336/223 |
| 2008/0213472 A1 | 9/2008 | Song |
| 2009/0039999 A1 | 2/2009 | Fuji et al. ...................... 336/200 |
| 2009/0065919 A1 | 3/2009 | Jang et al. |
| 2009/0065924 A1* | 3/2009 | Kim et al. ...................... 257/690 |
| 2009/0107616 A1 | 4/2009 | Lyoo et al. |
| 2009/0146282 A1 | 6/2009 | Tay et al. ...................... 257/686 |
| 2009/0321911 A1* | 12/2009 | Son ............................... 257/686 |
| 2010/0013060 A1* | 1/2010 | Lamy et al. ................... 257/621 |
| 2010/0032710 A1* | 2/2010 | Bui et al. ....................... 257/127 |
| 2010/0237368 A1* | 9/2010 | Kojima et al. ................. 257/98 |
| 2011/0175215 A1* | 7/2011 | Farooq et al. ................. 257/686 |

FOREIGN PATENT DOCUMENTS

| | | |
|---|---|---|
| JP | 2002-151801 | 5/2002 |
| KR | 10-2008-0068299 | 7/2008 |
| KR | 10-2009-0044146 | 5/2009 |

OTHER PUBLICATIONS

Korean Office Action dated Apr. 13, 2012 issued in corresponding Korean Patent Application No. 10-2010-0032244.
Chinese Office Action mailed Feb. 27, 2013 for corresponding Chinese Application No. 201110094611.3.
Chinese Office Action issued Aug. 16, 2013 in corresponding Chinese Application No. 201110094611.3.
Restriction Requirement mailed from the United States Patent and Trademark Office on Mar. 2, 2012 in the related U.S. Appl. No. 13/064,437.
Office Action mailed from the United States Patent and Trademark Office on Jun. 28, 2012 in the related U.S. Appl. No. 13/064,437.
Office Action mailed from the United States Patent and Trademark Office on Feb. 13, 2013 in the related U.S. Appl. No. 13/064,437.
Office Action mailed from the United States Patent and Trademark Office on Jul. 25, 2013 in the related U.S. Appl. No. 13/064,437.
U.S. Appl. No. 13/064,437, filed Mar. 24, 2011, Seung Wook Park et al., Samsung Electro-Mechanics Co., Ltd. and Sungkyunkwan University Foundation for Corporate Collaboration.

* cited by examiner

METHOD OF FABRICATING A PACKAGE SUBSTRATE

CROSS-REFERENCE TO RELATED APPLICATIONS

This application is a U.S. divisional application filed under 37 CFR 1.53(b) claiming priority benefit of U.S. Ser. No. 13/064,437 filed in the United States on Mar. 24, 2011, now pending, which claims earlier foreign priority benefit to Korean Patent Application No. 10-2010-0032244 filed with the Korean Intellectual Property Office on Apr. 8, 2010, the disclosures of which are incorporated herein by reference.

BACKGROUND

1. Field

The present invention relates to a package substrate and a method fabricating thereof, and more particularly, to a package substrate capable of having a passive device having a predetermined capacity embedded therein, while reducing a pattern size and increasing component mounting density, and a method fabricating thereof.

2. Description of the Related Art

In accordance with the recent development of the electronic industry, the demand for compact, multi-functional electronic components has rapidly increased.

In accordance with this trend, there has been a demand for a package substrate having a high density circuit pattern. Therefore, various methods of implementing a fine circuit pattern have been designed and used.

An embedded process, which is one method of implementing the fine circuit pattern, has a structure in which a circuit is impregnated with an insulating material, and may improve the flatness and strength of a product and have less circuit damage, whereby the method is appropriate for implementing the fine circuit pattern.

In the case of the embedding process according to the related art, a substrate has been configured by mounting or stacking packages or devices directly on the substrate. In this case, when the packages are mounted on double sides or a single side of the substrate, the entire package area may be reduced.

Accordingly, various researches into an embedded process or structure for an active device and an LRC device have been conducted.

However, in the case in which the substrate having the electronic device embedded therein is fabricated according to the related art, there is a risk that the electronic device may be damaged due to use of adhesive tape, or the like, and a fabricating process of the substrate is significantly complicated.

SUMMARY

An aspect of the present invention provides a package substrate capable of corresponding to a fine pitch, while securing an interval between packages required when electronic devices are stacked on a bottom package, by forming metal bumps on an upper surface of the bottom package and bonding each of solder balls coupled to a lower surface of a top package and solder balls coupled to an lower surface of the electronic devices to the metal bumps, and a method fabricating thereof.

According to an aspect of the present invention, there is provided a package substrate, including: a wafer having a cavity formed in an upper surface thereof, the cavity including a chip mounting region; a first wiring layer and a second wiring layer formed to be spaced apart from the first wiring layer, which are formed to be extended in the cavity; a chip positioned in the chip mounting region to be connected to the first wiring layer and the second wiring layer; a through-hole penetrating through the wafer and a via filling the through-hole; and one or more electronic device connected to the via.

The via may be connected to the electronic device or an external device through solder bumps.

The chip may be a multilayer ceramic capacitor (MLCC).

The electronic device may be at least one selected from a resistor and an inductor.

The wafer may be made of silicon.

The package substrate may further include an insulating layer formed to cover the chip and the electronic device and exposing a portion of the first and second wiring layers.

According to another aspect of the present invention, there is provided a method of fabricating a package substrate, including: forming a cavity in at least one region of an upper surface of a wafer, the cavity including a chip mounting region; forming a through-hole penetrating through the wafer and a via filling the through-hole; forming a first wiring layer and a second wiring layer spaced apart from the first wiring layer, which are extended into the cavity; and mounting a chip in the cavity to be connected to the first wiring layer and the second wiring layer.

The method may further include a polishing at least one of the upper surface and a lower surface of the wafer before the forming of the cavity.

The forming of the cavity may include: forming a first insulating film on the upper surface of the wafer; forming a first insulating pattern for forming the cavity by etching the first insulating film; and forming the cavity by etching the wafer using the first insulating pattern.

The forming of the cavity by etching the wafer may include wet etching of the wafer using a potassium hydroxide (KOH) solution.

The forming of the through-hole may include: forming a first photosensitive resin layer on the upper surface or a lower surface of the wafer; forming a first photosensitive pattern by exposing and developing the first photosensitive resin layer; and forming the through-hole by etching the wafer using the first photosensitive pattern.

The forming of the via may include: forming a second insulating film on a surface of the wafer including the through-hole and the cavity; forming a plating seed layer on the second insulating film; and filling the through-hole with a conductive material using an electroplating method.

The forming of the first wiring layer and the second wiring layer may include: forming a second photosensitive pattern on a region in the wafer, in which the first wiring layer and the second wiring layer are not formed; forming a wiring material on the upper surface of the wafer; removing the second photosensitive pattern and the wiring material formed on the second photosensitive pattern using a lift-off method.

The method may further include bonding the chip to each of the first wiring layer and the second wiring layer by allowing the wafer to reflow, after the mounting of the chip in the cavity.

The chip may be a multilayer ceramic capacitor (MLCC).

The electronic device may be at least one selected from a resistor and an inductor.

The method may further include forming an insulating layer exposing a portion of the first and second wiring layers and covering the chip and the electronic device.

The method may further include connecting the via to the electronic device or an external device through solder bumps.

An aspect of the present invention provides a package substrate capable of corresponding to a fine pitch, while securing an interval between packages required when electronic devices are stacked on a bottom package, by forming metal bumps on an upper surface of the bottom package and bonding each of solder balls coupled to a lower surface of a top package and solder balls coupled to an lower surface of the electronic devices to the metal bumps, and a method fabricating thereof.

According to an aspect of the present invention, there is provided a package substrate, including: a wafer having a cavity formed in an upper surface thereof, the cavity including a chip mounting region; a first wiring layer and a second wiring layer formed to be spaced apart from the first wiring layer, which are formed to be extended in the cavity; a chip positioned in the chip mounting region to be connected to the first wiring layer and the second wiring layer; a through-hole penetrating through the wafer and a via filling the through-hole; and one or more electronic device connected to the via.

The via may be connected to the electronic device or an external device through solder bumps.

The chip may be a multilayer ceramic capacitor (MLCC).

The electronic device may be at least one selected from a resistor and an inductor.

The wafer may be made of silicon.

The package substrate may further include an insulating layer formed to cover the chip and the electronic device and exposing a portion of the first and second wiring layers.

According to another aspect of the present invention, there is provided a method of fabricating a package substrate, including: forming a cavity in at least one region of an upper surface of a wafer, the cavity including a chip mounting region; forming a through-hole penetrating through the wafer and a via filling the through-hole; forming a first wiring layer and a second wiring layer spaced apart from the first wiring layer, which are extended into the cavity; and mounting a chip in the cavity to be connected to the first wiring layer and the second wiring layer.

The method may further include a polishing at least one of the upper surface and a lower surface of the wafer before the forming of the cavity.

The forming of the cavity may include: forming a first insulating film on the upper surface of the wafer; forming a first insulating pattern for forming the cavity by etching the first insulating film; and forming the cavity by etching the wafer using the first insulating pattern.

The forming of the cavity by etching the wafer may include wet etching of the wafer using a potassium hydroxide (KOH) solution.

The forming of the through-hole may include: forming a first photosensitive resin layer on the upper surface or a lower surface of the wafer; forming a first photosensitive pattern by exposing and developing the first photosensitive resin layer; and forming the through-hole by etching the wafer using the first photosensitive pattern.

The forming of the via may include: forming a second insulating film on a surface of the wafer including the through-hole and the cavity; forming a plating seed layer on the second insulating film; and filling the through-hole with a conductive material using an electroplating method.

The forming of the first wiring layer and the second wiring layer may include: forming a second photosensitive pattern on a region in the wafer, in which the first wiring layer and the second wiring layer are not formed; forming a wiring material on the upper surface of the wafer; removing the second photosensitive pattern and the wiring material formed on the second photosensitive pattern using a lift-off method.

The method may further include bonding the chip to each of the first wiring layer and the second wiring layer by allowing the wafer to reflow, after the mounting of the chip in the cavity.

The chip may be a multilayer ceramic capacitor (MLCC).

The electronic device may be at least one selected from a resistor and an inductor.

The method may further include forming an insulating layer exposing a portion of the first and second wiring layers and covering the chip and the electronic device.

The method may further include connecting the via to the electronic device or an external device through solder bumps.

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Figure 1:
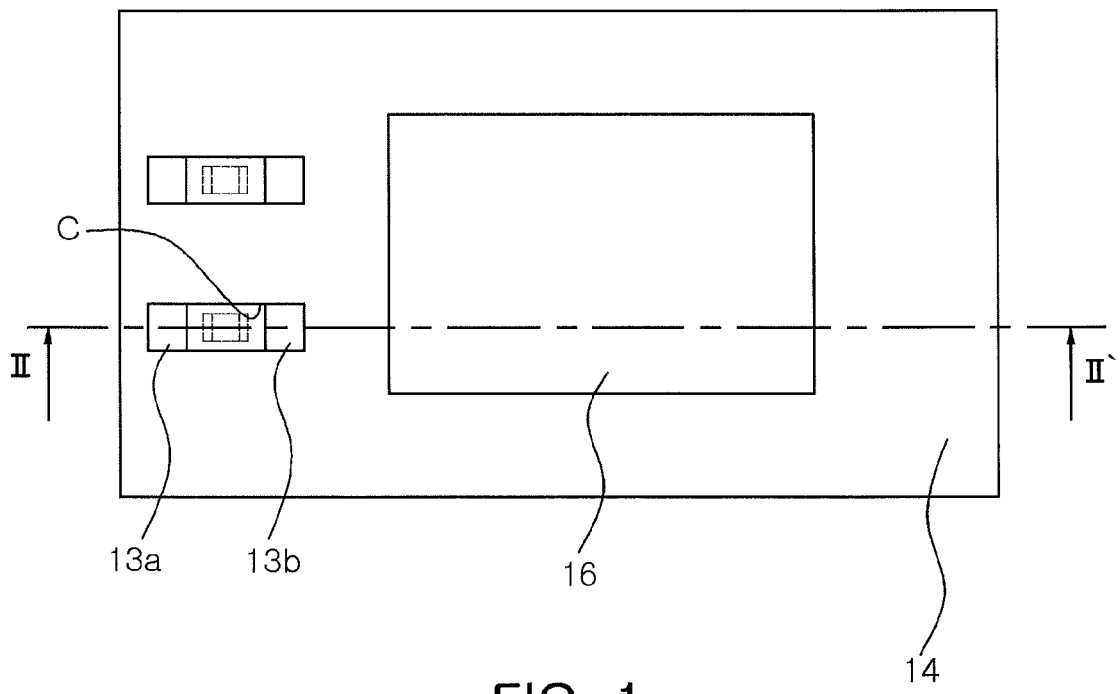
FIG. 1 is a top plan view schematically showing a package substrate according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the shapes and dimensions may be exaggerated for clarity, and the same reference numerals will be used throughout to designate the same or like components.

Hereinafter, a package substrate according to an exemplary embodiment of the present invention will be described with reference to FIGS. 1 and 2.

Figure 2:
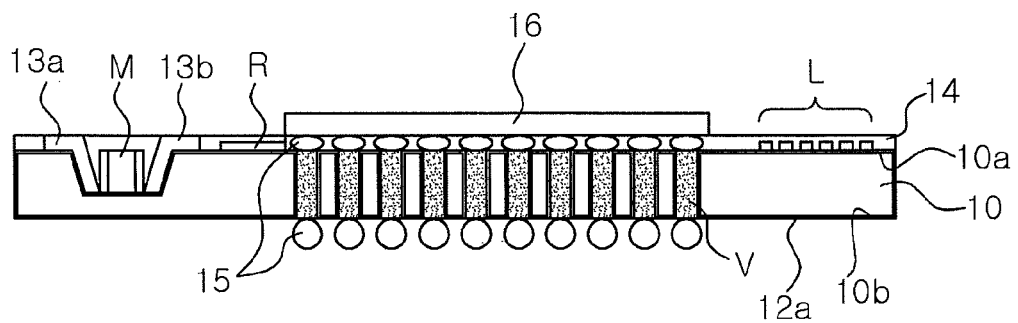
FIG. 2 is a cross-sectional view taken along line II-II' of FIG. 1.

FIG. 1 is a top plan view schematically showing a package substrate 1 according to an exemplary embodiment of the present invention, and FIG. 2 is a cross-sectional view taken along line II-II' of FIG. 1.

A package substrate according to an exemplary embodiment of the present invention is configured to include a wafer 10 having a cavity C formed in an upper surface thereof, the cavity including a chip mounting region T, a first wiring layer 13a and a second wiring layer 13b formed to be spaced apart from the first wiring layer 13a, which are formed to be extended in the cavity C, a chip M positioned in the chip mounting region T to be connected to the first wiring layer 13a and the second wiring layer 13b, a through-hole H penetrating through the wafer 10, a via V filled in the through-hole H, and one or more electronic devices R and L connected to the via V.

Herein, the package substrate 1 may further include an insulating layer 14 covering the chip M and the electronic devices R and L and exposing a portion of the first wiring layer 13a and the second wiring layer 13b.

Herein, the wafer 10 may be made of silicon, and the via V may be connected to the electronic devices R and L or an external device 16 through solder bumps 15.

In addition, the chip M may be a multilayer ceramic capacitor (MLCC), and the electronic devices R and L may be at least one selected from a resistor and an inductor. However, the chip M and the electronic devices R and L are not limited thereto.

Hereinafter, a method of fabricating a package substrate according to an exemplary embodiment of the present invention will be described with reference to FIGS. 3A through 3K.

FIGS. 3A through 3K are cross-sectional views schematically showing a method of fabricating a package substrate according to an exemplary embodiment of the present invention.

A method of fabricating a package substrate 1 according to an exemplary embodiment of the present invention includes forming a cavity in at least one region of an upper surface of a wafer 10, the cavity including a chip mounting region T, forming a through-hole H penetrating through the wafer 10 and a via V filled in the through-hole H, forming a first wiring layer 13a and a second wiring layer 13b spaced apart from the first wiring layer 13a, which are extended in the cavity C, and a mounting a chip M in the cavity C to be connected to the first wiring layer 13a and the second wiring layer 13b.

Figure 3A:
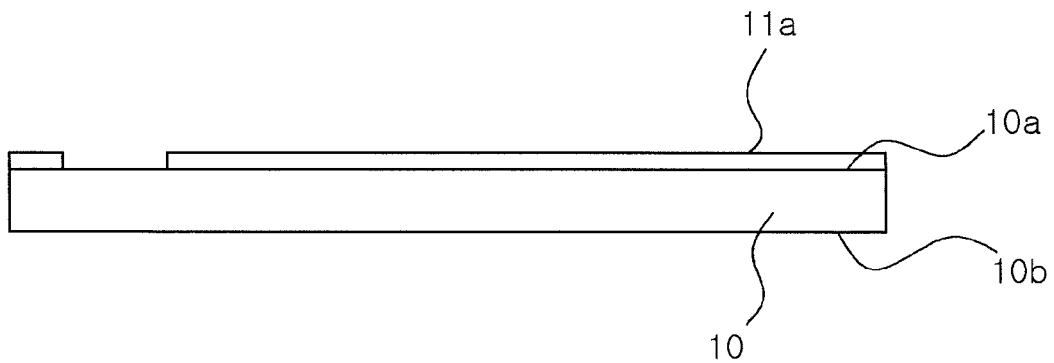
FIGS. 3A through 3K are cross-sectional views schematically showing a method of fabricating a package substrate according to an exemplary embodiment of the present invention.

As shown in FIG. 3A, a first insulating film (not shown) is formed on the upper surface of the wafer 10 and is then etched to form a first insulating pattern 11a for forming the cavity C. Herein, the first insulating film may be made of silicon nitride (Si3N4); however, a material of forming the first insulating film is not limited thereto. In addition, as an etching method of the first insulating film, a reactive ion etching (RIE) method may be used; however, an etching method thereof is not limited thereto.

Figure 3B:
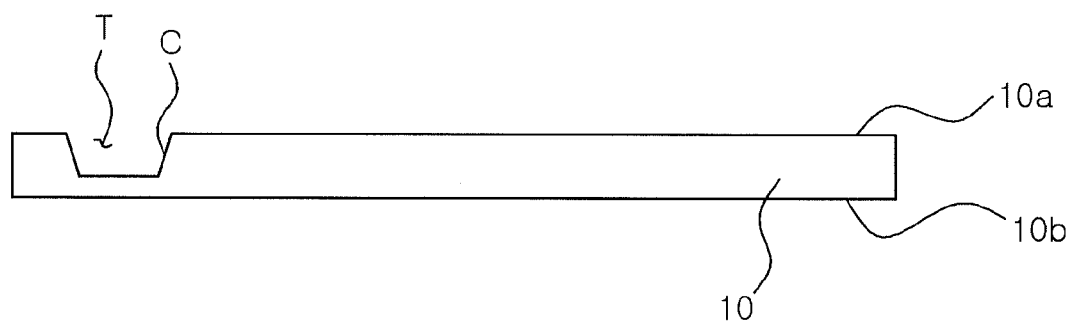

Then, as shown in FIG. 3B, the cavity C is formed in the upper surface of the waver 10 by using the first insulating pattern 11a as a mask. Herein, the wafer 10 may be subject to wet etching using a potassium hydroxide (KOH) solution by using the first insulating pattern 11a as the mask; however, solution used in the wet etching is not limited thereto.

Figure 3C:
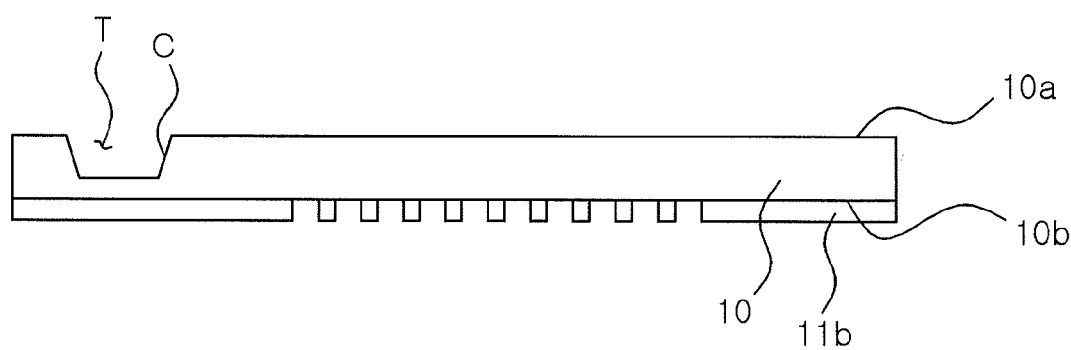

Thereafter, as shown in FIG. 3C, a first photosensitive resin layer (not shown) is formed on a lower surface of the wafer 10 and is then exposed and developed to form a first photosensitive pattern 11b.

Figure 3D:
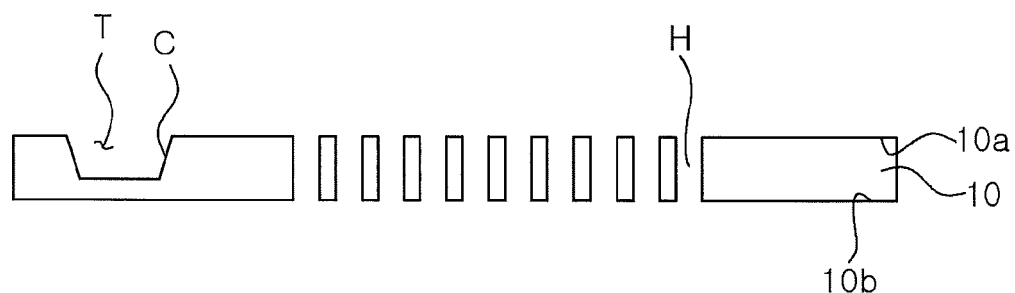

Next, as shown in FIG. 3D, the wafer 10 is etched using the first photosensitive pattern as a mask to form the through-hole H. Herein, as an etching method of the wafer 10, a RIE method may be used; however, an etching method thereof is not limited thereto.

Figure 3E:
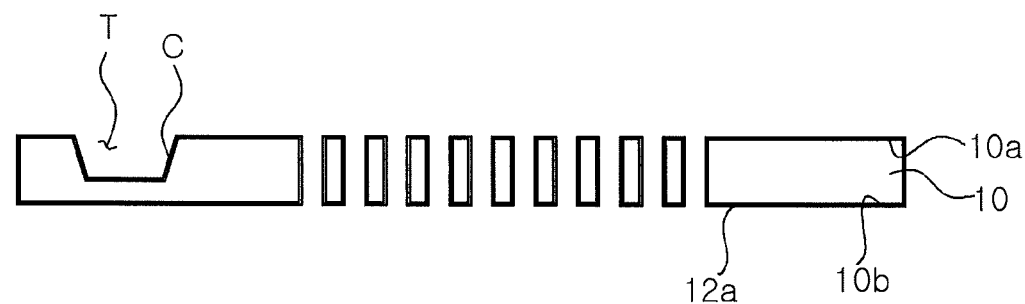

Thereafter, as shown in FIG. 3E, a second insulating film 12a is formed on a surface of the wafer 10 including the through-hole H and the cavity C, and a plating seed layer (not shown) is formed on the second insulating film 12a. Herein, the second insulating film 12a may be made of silicon oxide (SiO2); however, a material of the second insulating film 12a is not limited thereto.

Figure 3F:
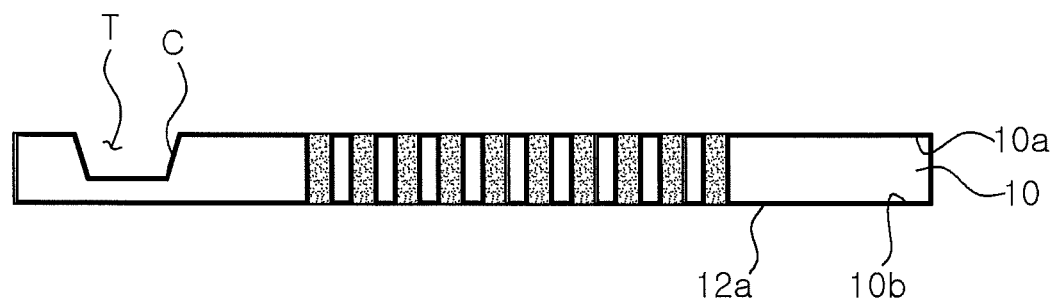

Then, as shown in FIG. 3F, the via V is formed by filling the through-hole H with a conductive material using an electroplating method.

Figure 3G:
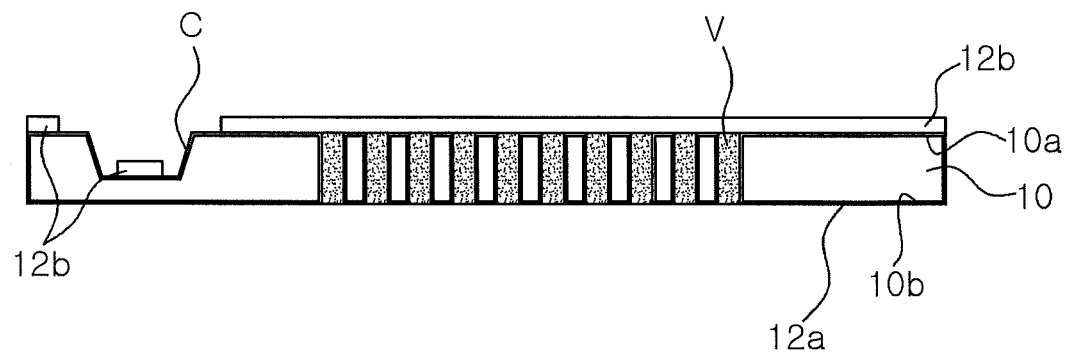
Figure 3H:
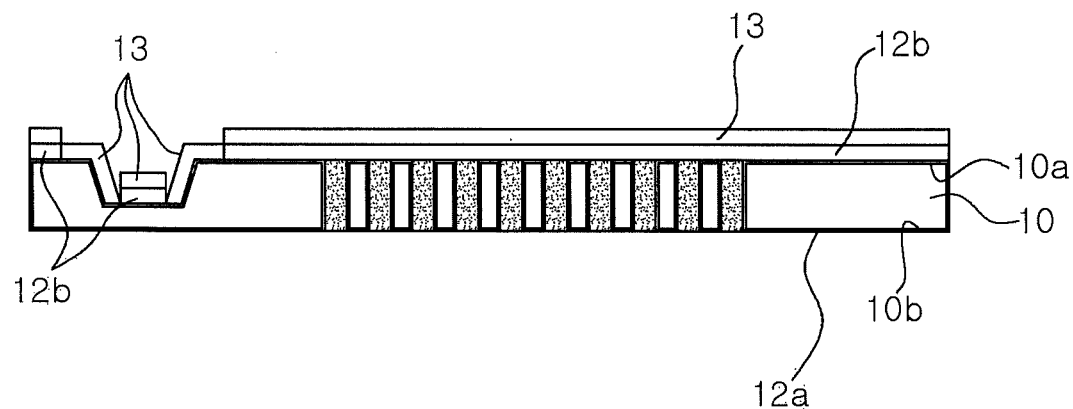

Next, as shown in FIG. 3G, a second photosensitive pattern 12b is formed on a region in the wafer 10, in which the first wiring layer 13a and the second wiring layer 13b are not formed. Then, as shown in FIG. 3H, a wiring material 13 is formed on the upper surface of the wafer 10.

Figure 3I:
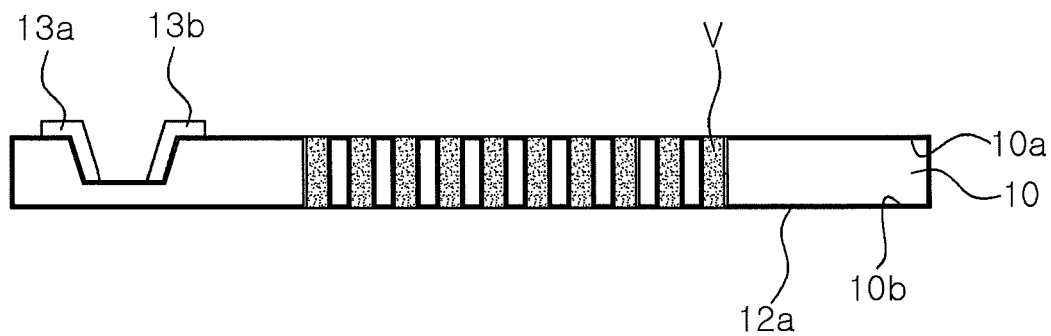

Then, as shown in FIG. 3I, the second photosensitive pattern 12b and the wiring material 13 formed on the second photosensitive pattern 12b are simultaneously removed by a liftoff method. When the wafer 10 is immersed into an organic solvent and then slightly shaken, the second photosensitive pattern 12b is dissolved, and/or the organic solvent is penetrated into an interface between the wafer 10 and the second photosensitive pattern 12b, whereby the second photosensitive pattern 12b and the wiring material 13 formed on the second photosensitive pattern 12b may be simultaneously removed. Accordingly, the first wiring layer 13a and the second wiring layer 13b may be formed in portions in which they are intended to be formed.

Figure 3J:
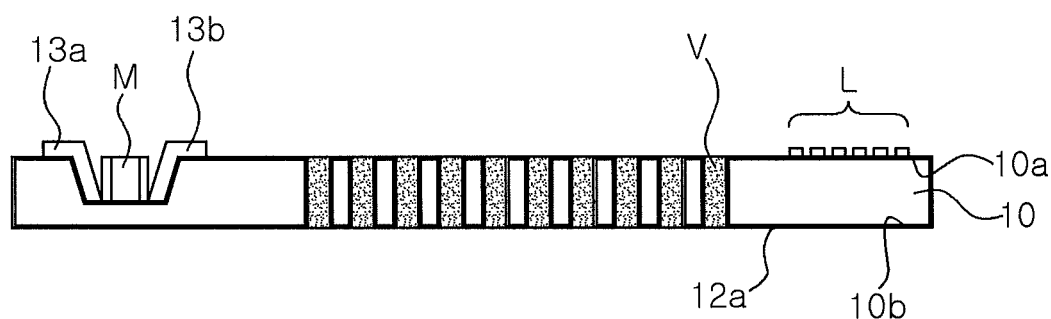

Thereafter, as shown in FIG. 3J, the chip M is mounted in the cavity C, and the wafer 10 then reflows to individually bond the chip M to the first wiring layer 13a and the chip M to the second wiring layer 13b. Herein, the chip M may be the multilayer ceramic capacitor (MLCC).

Figure 3K:
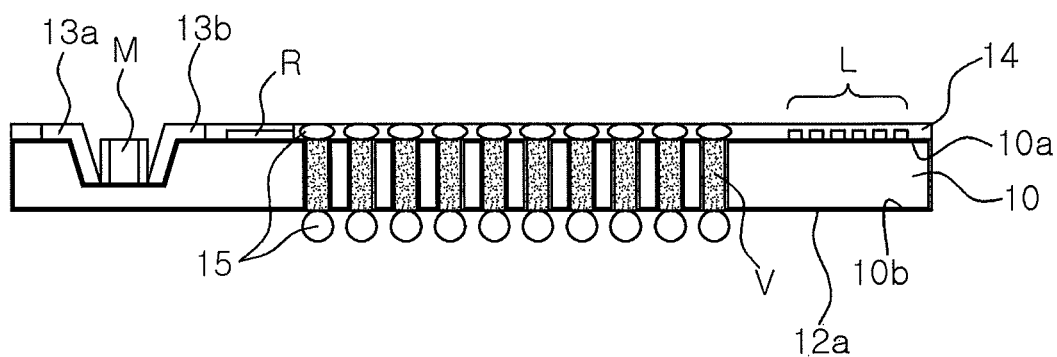

Next, as shown in FIG. 3K, after the electronic devices R and L are mounted, and the insulating layer 14 exposing a portion of the first wiring layer 13a and the second wiring layer 13b and covering the chip M and the electronic devices R and L is formed. In addition, the via V is connected to the electronic devices R and L or the external device 16 through the solder bumps 15 to complete the package substrate as shown in FIGS. 1 and 2.

As set forth above, according to an exemplary embodiment of the present invention, package substrate capable of having the passive device having a predetermined capacity embedded therein, while reducing the pattern size and increasing the component mounting density, and a method fabricating thereof may be provided.

While the present invention has been shown and described in connection with the exemplary embodiments, it will be apparent to those in the art that modifications and variations can be made without departing from the spirit and scope of the invention as defined by the appended claims. Accordingly, various substitution, modifications and alteration may be made within the scope of the present invention may be made by those skilled in the art without departing from the spirit of the prevent invention defined by the accompanying claims.

What is claimed is:

1. A method of fabricating a package substrate, comprising:
    forming a cavity in at least one region of an upper surface of a wafer, the cavity including a chip mounting region;
    forming a through-hole penetrating through the wafer and a via filling the through-hole;
    forming a first wiring layer and a second wiring layer spaced apart from the first wiring layer, which are extended into the cavity, the forming of the first wiring layer and the second wiring layer including
        forming a second photosensitive pattern on a region in the wafer, in which the first wiring layer and the second wiring layer are not formed,
        forming a wiring material on the upper surface of the wafer, and
        removing the second photosensitive pattern and the wiring material formed on the second photosensitive pattern using a lift-off method; and
    mounting a chip in the cavity to be connected to the first wiring layer and the second wiring layer.

2. The method of claim 1, further comprising polishing at least one of the upper surface and a lower surface of the wafer before the forming of the cavity.

3. The method of claim 1, wherein the forming of the cavity includes:
    forming a first insulating film on the upper surface of the wafer;

forming a first insulating pattern for forming the cavity by etching the first insulating film; and forming the cavity by etching the wafer using the first insulating pattern.

4. The method of claim 3, wherein the forming of the cavity by etching the wafer includes wet etching of the wafer using a potassium hydroxide (KOH) solution.

5. The method of claim 1, wherein the forming of the through-hole includes:

forming a first photosensitive resin layer on the upper surface or a lower surface of the wafer;

forming a first photosensitive pattern by exposing and developing the first photosensitive resin layer; and forming the through-hole by etching the wafer using the first photosensitive pattern.

6. The method of claim 1, wherein the forming of the via includes:

forming a second insulating film on a surface of the wafer including the through-hole and the cavity;

forming a plating seed layer on the second insulating film; and filling the through-hole with a conductive material using an electroplating method.

7. The method of claim 1, further comprising bonding the chip to each of the first wiring layer and the second wiring layer by allowing the wafer to reflow, after the mounting of the chip in the cavity.

8. The method of claim 1, wherein the chip is a multilayer ceramic capacitor (MLCC).

9. The method of claim 1, wherein the package substrate comprises an electronic device that is at least one selected from a resistor and an inductor.

10. The method of claim 9, further comprising forming an insulating layer exposing a portion of the first and second wiring layers and covering the chip and the electronic device.

11. The method of claim 1, further comprising connecting the via to an electronic device or an external device through solder bumps.

12. A method of fabricating a package substrate having an electronic device that is at least one selected from a resistor and an inductor, the method comprising:

forming a cavity in at least one region of an upper surface of a wafer, the cavity including a chip mounting region;

forming a through-hole penetrating through the wafer and a via filling the through-hole;

forming a first wiring layer and a second wiring layer spaced apart from the first wiring layer, which are extended into the cavity;

mounting a chip in the cavity to be connected to the first wiring layer and the second wiring layer; and forming an insulating layer exposing a portion of the first and second wiring layers and covering the chip and the electronic device.

* * * * *